United States Patent
Grosenbacher

(10) Patent No.: US 6,596,091 B1
(45) Date of Patent: Jul. 22, 2003

(54) METHOD FOR SWEEPING CONTAMINANTS FROM A PROCESS CHAMBER

(75) Inventor: Tim Grosenbacher, Shiner, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/069,274

(22) Filed: Apr. 29, 1998

(51) Int. Cl.$^7$ .............................. B08B 5/04; B08B 9/00
(52) U.S. Cl. ..................... 134/21; 134/21; 134/22.1; 134/22.18; 134/30; 134/37; 34/412
(58) Field of Search .................. 134/21, 19, 22.1, 134/22.18, 30, 37; 34/412

(56) References Cited

U.S. PATENT DOCUMENTS

| | | | |
|---|---|---|---|
| 4,892,615 A | | 1/1990 | Motta |
| 5,238,503 A | * | 8/1993 | Phenix et al. .................. 134/37 |
| 5,273,589 A | * | 12/1993 | Griswold et al. ............. 134/21 |
| 5,512,106 A | * | 4/1996 | Tamai et al. ................... 134/7 |
| 5,536,330 A | * | 7/1996 | Chen et al. .................... 134/21 |
| 5,678,759 A | | 10/1997 | Grenci et al. |
| 5,759,287 A | * | 6/1998 | Chen et al. .................... 134/21 |

OTHER PUBLICATIONS

International Search Report for PCT/US99/07973, Aug. 3, 1999, 6 pages.

* cited by examiner

Primary Examiner—Randy Gulakowski
Assistant Examiner—Saeed Chaudhry
(74) Attorney, Agent, or Firm—Thomason, Moser & Patteson

(57) ABSTRACT

A method for preparing a chamber prior to semiconductor processing includes the step of flowing a non-reactive gas, preferably argon, through the chamber at a pressure below 4 Torr to sweep contaminants from the chamber. The chamber pressure is reduced to less than 1 Torr prior to sweeping with argon, and the sweeping cycle is repeated as needed to remove contaminants. The chamber is heated during subsequent sweep cycles to enhance removal of contaminants. Following the sweep cycles, remaining contaminants are baked out at a chamber pressure less than $6.0 \times 10^{-6}$ Torr. The method substantially bakes out moisture and other contaminants from the chambers in less than 8 hours, and prepares the chamber for processing in less than one day.

20 Claims, 1 Drawing Sheet

METHOD FOR SWEEPING CONTAMINANTS FROM A PROCESS CHAMBER

BACKGROUND OF THE INVENTION

1. Field of the Invention

The present invention relates generally to chambers used in semiconductor processing, and more specifically to a method and apparatus for removing contaminants from chambers to enhance performance of the chambers.

2. Background of Related Art

Thin film deposition apparatus and techniques are used, among other techniques, to provide thin film layers on semiconductor substrates. One well known prior art deposition process is physical vapor deposition, generally referred to as sputtering, wherein substrates are typically moved through load locks and into high vacuum processing chambers which enclose the substrate and a target composed of the material desired to be deposited on the substrate. A negative voltage applied to the target excites into a plasma state an inert gas (typically argon) supplied to the chamber, and ions from the plasma bombard the target and eject particles of target material which deposit on the substrate to form the desired film. In some sputtering process applications, the substrate may be heated to temperatures on the order of about 350° C. to about 510° C. or higher, to reflow a film layer deposited on the substrate by sputtering.

The low pressure, high temperature environments typically utilized in deposition processes cause out gassing of contaminants such as hydrogen ($H_2$), water ($H_2O$) and air (mostly $O_2$ and $N_2$), from the substrates and from the internal walls of the processing chamber. These contaminants, are released slowly and are often detrimental to the film layer which is deposited onto the substrate.

Contaminants which are out gassed from the processing chamber walls should also be removed from the processing chambers to improve the processing environment. However, out gassing of the chamber walls continues for many hours and it is not feasible to reduce the chamber pressure sufficiently to draw out all of the contaminants prior to processing of wafers in the processing chamber. A typical method for reducing out gassing from chamber walls of a new chamber is to bake out the contaminants by initially reducing the chamber pressure substantially below an acceptable processing pressure and raising the chamber temperature above an acceptable processing temperature for about 28 hours. Following bake out, the chamber pressure is raised to the processing pressure by adding a clean gas, and the chamber temperature is lowered to the processing temperature. The increase in chamber pressure and decrease in chamber temperature substantially slows down the out gassing of contaminants.

U.S. Pat. No. 5,536,330 describes sweeping of contaminants from a vacuum chamber during bake out by flowing preheated argon through the chamber at a pressure above 50 Torr. The argon is preheated to a temperature of at least 90° C., preferably from about 150 to 250° C. The argon sweep is performed for a sufficient amount of time to remove contaminants prior to reducing the pressure within the chamber and testing for remaining contaminants. The bake out of a 5 liter chamber can be completed in 15 hours when combined with a hot argon sweep if the chamber is repeatedly swept with argon and pumped to a low pressure. After bake out, the chamber is cooled for over 18 hours prior to processing of semiconductor substrates.

U.S. Pat. No. 5,678,759 describes gas compressors configured to heat a purge gas for sweeping contaminants from a chamber. The gas compressors directly heat the gas molecules which minimizes heating of chamber components and thus reduces cooling time.

Several days are typically required to remove contaminants from a 5 liter chamber with a hot argon sweep and then cool down the chamber to processing temperatures at a chamber pressure less than $10^{-8}$ Torr. The time required can be reduced by heating the gas with a series of gas compressors, and thus reducing the time required for chamber cooling. However, considerable time is still required to evacuate the chamber after each argon sweep to purge the contaminants. Therefore, there is a need for a method for removing contaminants from the processing chamber walls in less time to improve productivity of the processing chambers.

SUMMARY OF THE INVENTION

The present invention provides a method for preparing a vacuum chamber prior to semiconductor processing. The method includes the step of flowing a non-reactive gas, preferably argon, through the vacuum chamber at a pressure below about 4 Torr to sweep contaminants from the vacuum chamber. The chamber pressure is reduced to less than about 100 mTorr after sweeping with argon, and the sweeping cycle is repeated as needed to remove contaminants. The gas, the chamber or both are heated during subsequent sweep cycles to enhance removal of contaminants. Following the sweep cycles, remaining contaminants are baked out at a chamber pressure less than about $6 \times 10^{-6}$ Torr. The method substantially removes moisture and other contaminants from the chamber in less than 8 hours, and prepares the chamber for processing in less than one day.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are, therefore, not to be considered limiting of its scope, for the invention may admit to other equally effective embodiments.

DETAILED DESCRIPTION OF THE INVENTION

Figure 1:
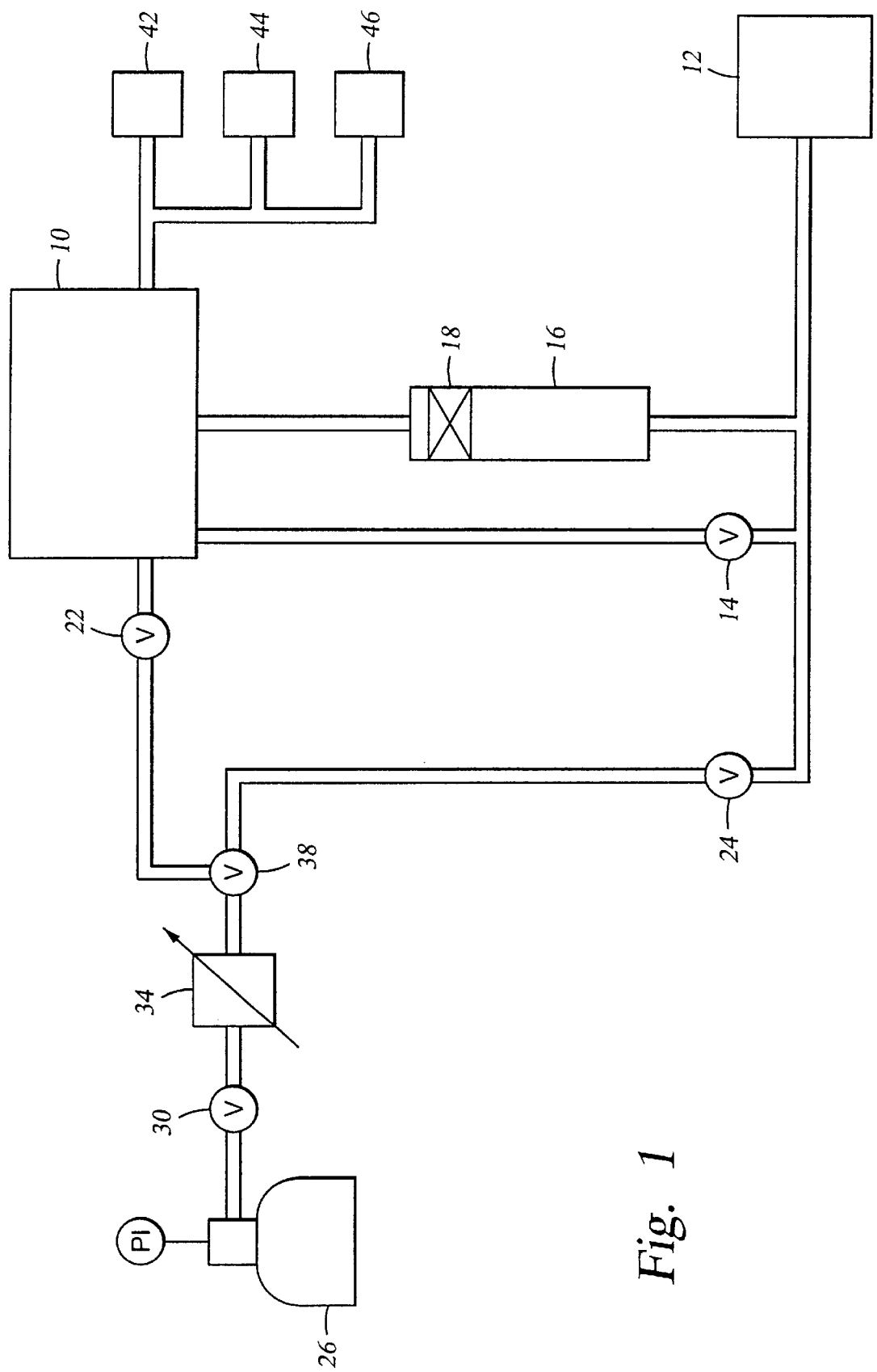
FIG. 1 is a schematic view of a semiconductor processing chamber having a non-reactive gas source for sweeping the chamber at low pressure prior to, and during, bake out of the chamber.

The present invention provides a method for preparing a chamber prior to semiconductor processing which includes the steps of a) evacuating the chamber to a pressure less than about 1 Torr, b) flowing a non-reactive gas through the chamber at a pressure below about 4 Torr, c) repeating steps a) and b) to sweep contaminants from the chamber, and d) evacuating the chamber to a pressure below about 50 mTorr to remove substantially all of the non-reactive gas from the chamber. The non-reactive gas can be argon, nitrogen, or neon, preferably high purity argon. Flowing of the non-reactive gas preferably occurs in sweep cycles lasting from about 5 to about 8 minutes for a chamber having a volume of about 5 liters. Initial sweep cycles are preferably conducted at a temperature less than about 50° C. Subsequent sweep cycles are combined with heating of the chamber and/or the non-reactive gas to assist in removing the contaminants. Removal of contaminants can be completed in eight hours without exceeding a chamber wall temperature of 120° C., and allows preparation of the chamber in one day. The method can be performed in a dedicated bake out unit to condition the chamber prior to mounting the chamber on a cluster tool. Alternatively, the method can be programmed into process controllers on the cluster tool.

A preferred method for preparing a physical vapor deposition chamber prior to semiconductor processing includes the steps of a) evacuating the chamber to a pressure less than about 1 Torr, b) flowing ultra high purity argon through the chamber at a pressure below about 4 Torr and a temperature below about 50° C., and c) repeating steps a) and b) for at least three cycles to sweep moisture from the chamber prior to heating the argon or the chamber. After removal of moisture, chamber preparation continues by the steps of d) evacuating the chamber to less than about 70 mTorr, e) flowing ultra high purity argon through the chamber at a pressure from about 2.4 to about 3.6 Torr and a temperature above 90° C., and f) repeating steps d) and e) for at least ten cycles to sweep additional contaminants from the chamber. The argon remaining in the chamber is then removed by reducing the pressure of the chamber below about 20 mTorr by opening the gate valve to a cryogenic pump. Heating of the chamber without an argon sweep then continues for preferably about six hours at a pressure below about $6 \times 10^{-6}$ Torr and a temperature above about 90° C. Heating above 120° C. increases cooling time without substantial benefit to preparation of the chamber.

FIG. 1 is a schematic diagram of a semiconductor processing chamber 10 which is initially evacuated by a roughing pump 12 through an open shut-off valve 14. A high vacuum pump 16, such as a cryogenic pump, then evacuates the chamber 10 through a control gate valve 18 by closing the shut-off valve 14 and opening the gate valve 18. The high vacuum pump 16 continues to pump the chamber 10 during processing of semiconductor wafers. One or more non-reactive gases (one shown) are selectively provided to the processing chamber 10 through a final inlet valve 22. The non-reactive gases are preferably supplied from ultra high purity gas cylinders 26 through cylinder shut-off valves 30. The flow rate of the non-reactive gas is typically controlled with a mass flow controller 34.

A temperature probe 42 is used to monitor the chamber temperature during sweeping of the chamber and bake out of contaminants. Heating is preferably accomplished with heating devices (not shown) provided in the processing chamber 10 or by resistive heat tape wrapped around the chamber 10 and/or the gas lines. Optionally, the non-reactive gas can be heated by compressors or heat exchangers prior to entering the processing chamber 10. Available heating devices in commercial semiconductor processing chambers include resistive heating elements and infra-red lamps positioned to heat the chamber walls, process gases, or a substrate positioned in the chamber.

An equilibrium pressure gauge 44, preferably a convector, is used to monitor the chamber equilibrium pressure and the data received from the connection is used to adjust the flow of the non-reactive gas. An ion pressure gauge 46 is used to measure high vacuum when the chamber is pumped below 20 mTorr.

The processing chamber is preferably a PVD chamber manufactured by Applied Materials, Inc. However, any vacuum processing chamber can be conditioned in accordance with the present invention. The method also takes advantage of the availability of vacuum systems and gas sources on a processing platform which supports the processing chamber.

EXAMPLE

A PVD processing chamber having a volume of 5 liters was conditioned according to the present invention by sweeping contaminants from the chamber with ultra-high purity argon at a pressure less than about 4 Torr. The chamber was satisfactorily conditioned for mounting on an Applied Materials Endura™ multichamber semiconductor processing system available from Applied Materials, Inc., Santa Clara, Calif. The flow of argon was regulated by a needle control valve and introduced into the chamber through a pneumatic vent valve. An Ebara A07 roughing pump attached to a pneumatic roughing valve on the chamber was used to provide a chamber pressure less than about 1 Torr. The Endura™ processing system includes a controller which can be programmed to conduct the process of the invention.

When the chamber achieved a pressure less than about 1 Torr, the flow or argon was adjusted to provide an equilibrium pressure in the chamber of about 3±0.6 Torr. The actual flow rate of argon was about 3120 sccm. The argon sweep continued for 5 minutes and then the flow of argon was stopped and the chamber pressure was reduced by the roughing pump to 70 mTorr in about one minute. The combination of the 5 minute argon sweep and the subsequent chamber evacuation for one minute are identified below as a 6 minute sweep cycle. Operation of the chamber valves to perform the sweep cycles can also be programmed into the Endura™ processing system.

The chamber was swept with argon and evacuated to 70 mTorr for a total of three 6 minute sweep cycles at 20° C. before the chamber was heated by infra-red lamps. The low temperature sweep cycles prevent oxidation of the substrate support member. The 6 minute sweep cycles then continued for a total of twenty 6 minute sweep cycles which were completed in 2 hours. The chamber temperature exceeded 90° C. for at least ten sweep cycles and attained a maximum wall temperature of 120° C. The chamber pressure was then reduced to about 20 mTorr by the roughing pump.

By reducing the chamber pressure to about 20 mTorr, a majority of the argon was removed from the chamber prior to maximum heating of the chamber to bake out contaminants. The chamber was prepared for bake out without an argon sweep by reducing the pressure to less than $6 \times 10^{-6}$ Torr using a CTI Cryo ultra high vacuum pump. The chamber was then baked for 6 hours by selecting maximum heating from the infra-red lamps within the chamber. For chambers having internal resistive heaters, the bake out would preferably extend for 2 hours with maximum heating from the infra-red lamps and then four hours with a combination of maximum heating from the infra-red lamps and setting of the internal resistive heater to maintain 400° C. After heating for 6 hours, the lamps were turned off and the chamber was cooled down for 8 hours. The chamber pressure dropped to less than $6 \times 10^{-9}$ Torr which indicated that the chamber did not leak and was free of contamination.

The total bake out time for the low pressure argon sweep method of the invention was about 8 hours and chamber cooling required about 10 hours. The process significantly reduces the time required to remove contaminants in comparison to a bake out time of 15 hours for hot argon sweeps that occur at chamber pressures above 50 Torr. The cool down time is also significantly reduced by operating at a lower pressure. Further reduction in cool down time could be obtained by sweeping the chamber with pre-heated argon.

While the foregoing is directed to preferred embodiments of the present invention, other and further embodiments of the invention may be devised without departing from the basic scope thereof, and the scope thereof is determined by the claims which follow.

I claim:

1. A method for preparing a chamber prior to semiconductor processing, comprising the steps of:
   a) evacuating the chamber to less than about 1 Torr;
   b) flowing a non-reactive gas through the chamber at a pressure below about 4 Torr;
   c) repeating steps a) and b) to sweep contaminants from the chamber; and
   d) reducing the pressure of the chamber below about 50 mTorr to remove substantially all of the non-reactive gas from the chamber.

2. The method of claim 1, wherein steps a) and b) are repeated for at least three cycles before the chamber is heated above 50° C.

3. The method of claim 1, wherein steps a) and b) are repeated for at least ten cycles after the chamber is heated above 90° C.

4. The method of claim 1, wherein the chamber is evacuated in step a) to less than about 70 mTorr.

5. The method of claim 1, wherein the chamber is evacuated in step d) to less than about 20 mTorr.

6. The method of claim 1, further comprising the steps of:
   e) evacuating the chamber to less than about 4 Torr; and
   f) baking out contaminants at a temperature above 90° C. for at least 2 hours.

7. The method of claim 1, wherein the non-reactive gas comprises argon.

8. The method of claim 1, wherein the non-reactive gas is ultra high purity argon.

9. The method of claim 1, wherein steps a) and b) are repeated for less than 3 hours.

10. The method of claim 1, wherein steps a) and b) are repeated for at least 20 cycles.

11. A method for preparing a chamber prior to processing, comprising the steps of:
   a) evacuating the chamber to less than about 1 Torr;
   b) flowing argon through the chamber at a pressure below about 4 Torr;
   c) repeating steps a) and b) to sweep moisture from the chamber before conducting the following steps;
   d) evacuating the chamber to less than about 70 mTorr;
   e) flowing argon through the chamber at a pressure below about 4 Torr and a temperature above about 90° C.;
   f) repeating steps d) and e) to sweep contaminants from the chamber; and
   g) reducing the pressure of the chamber below about 20 mTorr to remove substantially all argon from the chamber.

12. The method of claim 11, wherein steps a) and b) are repeated for at least three cycles at a temperature below about 50° C.

13. The method of claim 11, wherein steps d) and e) are repeated for at least ten cycles.

14. The method of claim 11, further comprising the steps of:
   h) evacuating the chamber to less than about 4 Torr; and
   i) baking out contaminants at a temperature above 90° C. for at least 2 hours.

15. The method of claim 11, wherein the chamber is a physical vapor deposition chamber.

16. The method of claim 11, wherein the argon is ultra high purity argon.

17. A method for preparing a physical vapor deposition chamber prior to semiconductor processing, comprising the steps of:
   a) evacuating the chamber to less than about 1 Torr;
   b) flowing ultra high purity argon through the chamber at a pressure below 4 Torr;
   c) repeating steps a) and b) for at least three cycles before conducting the following steps;
   d) evacuating the chamber to less than about 70 mTorr;
   e) flowing ultra high purity argon through the chamber at a pressure below 4 Torr and a temperature above 90° C.;
   f) repeating steps d) and e) for at least ten cycles;
   g) evacuating the chamber to less than about 20 mTorr to remove substantially all argon from the chamber;
   h) evacuating the chamber below about $6\times10^{-6}$ Torr; and
   i) baking out contaminants at a temperature above 90° C. for at least 6 hours.

18. The method of claim 17, wherein steps a) and b) are repeated for 3 cycles at a temperature below 50° C.

19. The method of claim 18, wherein steps d) and e) are repeated for 17 cycles.

20. The method of claim 19, wherein steps a) through i) are completed within 8 hours.

* * * * *